United States Patent [19]
Lee et al.

[11] Patent Number: 6,097,055
[45] Date of Patent: Aug. 1, 2000

[54] CAPACITOR AND METHOD FOR FABRICATING THE SAME

[75] Inventors: Se-Hyeong Lee; Jun Seo, both of Kyunggi-do, Rep. of Korea

[73] Assignee: Samsung Electronics Co., Ltd., Suwon, Rep. of Korea

[21] Appl. No.: 09/293,945

[22] Filed: Apr. 19, 1999

[30] Foreign Application Priority Data

Apr. 18, 1998 [KR] Rep. of Korea ...................... 98-13910

[51] Int. Cl.[7] .................................................. H01L 27/108
[52] U.S. Cl. .......................... 257/309; 257/296; 257/306; 257/311
[58] Field of Search ..................................... 257/296, 303, 257/304, 307, 308, 306, 309, 311; 438/253, 255, 396

[56] References Cited

U.S. PATENT DOCUMENTS

| | | | |
|---|---|---|---|
| 5,274,258 | 12/1993 | Ahn | 257/308 |
| 5,561,310 | 10/1996 | Woo et al. | 257/306 |
| 5,604,146 | 2/1997 | Tseng | 438/253 |
| 5,789,290 | 8/1998 | Sun | 438/253 |
| 5,792,693 | 8/1998 | Tseng | 438/254 |
| 5,889,301 | 3/1999 | Tseng | 257/308 |
| 5,959,322 | 9/1999 | Lee | 257/298 |

*Primary Examiner*—Tom Thomas
*Assistant Examiner*—Shouxiang Hu
*Attorney, Agent, or Firm*—Jones Volentine, LLP

[57] ABSTRACT

A multiple tubular shaped capacitor electrode of a semiconductor capacitor with an increased surface area and a method for fabricating thereof. The multiple tubular shaped capacitor includes at least two tubular shapes whose side portions are overlapped with each other. The multiple tubular shaped capacitor is made by forming an insulating layer over an etch stop layer including a contact plug, partially etching the insulating layer down to the contact plug and etch stop layer to form an opening composed of at least two upright cylindrical openings with side portions that define an overlap, and forming a conductive layer on a bottom and both side walls of the opening to form a storage node composed of at least two upright tubular shapes which are attached together at a vertical side section which defines an overlap portion of both tubular shapes to form a capacitor storage node.

10 Claims, 7 Drawing Sheets

CAPACITOR AND METHOD FOR FABRICATING THE SAME

BACKGROUND OF THE INVENTION

This invention relates to a capacitor electrode of a capacitor in a semiconductor device, and more specifically to methods for fabricating a multiple tubular like shaped capacitor electrode.

Dynamic Random Access Memory (DRAM) semiconductor devices are commodity products widely used in many electronic applications. A conventional DRAM cell capacitor includes a storage node and a plate node with a thin dielectric disposed there between. An access transistor whose gate is connected to a word line, is connected in series between one of the capacitor electrodes and a bit line. Data is stored as a presence or absence of charge on the storage node. The access transistor either isolates the data stored on the storage node when in a non-conducting state or allows the reading or writing of the data by coupling the capacitor storage node to a bit line when in a conducting state.

As integrated circuit technology is continually driven toward smaller device sizes, the area in which the DRAM cell occupies should be reduced to achieve a higher density. The capacitance of the DRAM cell is proportional to a capacitor electrode surface area and an adequate capacitance of the cell capacitor must be maintained for maintaining a proper charge storage retention period, which is a maximum time that the charge is maintained on the storage node before a refresh operation is required.

Many techniques for increasing the effective capacitance of a DRAM cell have been proposed. Many of these techniques involve fabricating a three dimensional capacitor electrode structure in order to maximize an effective electrode surface area in a given two dimensional space. However many of these techniques involve expensive and time consuming process steps.

Recently, new technologies have been developed to increase the effective electrode surface area by modifying the surface morphology of the capacitor electrode itself. For example, growing a hemispherical grain silicon (HSG) layer on a capacitor storage node will increase the effective electrode surface area, however it has several problems when using a design rule of less than approximately 0.21 microns. One such problem when using HSGs is twin-bit failure. Twin-bit failure occurs when there is insufficient area between adjacent storage nodes, such that the storage nodes become connected to each other through the HSGs.

Accordingly, there is a need for a capacitor electrode structure for very high density DRAM devices that achieves a large surface area while eliminating twin-bit failure. In addition, a method for fabricating a capacitor electrode structure is needed which minimizes process complexity in order to save on processing costs and processing time in forming a three dimensional capacitor electrode structure which may achieve a maximum amount of surface area in a minimum allowable area.

SUMMARY OF THE INVENTION

In a first principle aspect, the present invention is a method for forming a three dimensional capacitor electrode which exhibits a very large surface area for a high density integration memory device. When formed in a DRAM memory cell array, the capacitor can be stacked vertically over an access transistor to minimize the cell area. Also, a considerable portion of the capacitor electrode surface area is derived from inner and outer vertical wall sections thereby achieving a large amount of surface area in a given two dimensional space.

In addition to the above, the method for forming the present invention avoids complicated process steps and reduces the manufacturing cost.

In a preferred embodiment of this aspect of the present invention, a capacitor storage node of a stacked capacitor includes two upright tubular sections. Each upright tubular section is overlapped at an outer side wall portion and terminates at a bottom portion which is formed on a contact plug. In addition, the preferred embodiment stacks the capacitor storage node over an access transistor and field isolator via the contact plug for use in a high density DRAM memory array. Such a layout achieves a memory cell which includes a capacitor with a relatively large surface area and thus a large capacitance implemented in a minimum memory cell area.

In another principal aspect, the present invention is a method for forming a three dimensional capacitor electrode conductor with a large surface area by utilizing relatively fast and simple processing steps of forming a thick insulating layer such as an oxide on an etch stop layer (e.g., silicon nitride) and forming a plurality of circular like inlay openings in the thick insulating layer, such that each circular like inlay opening overlaps at a portion of an adjacent circular like inlay opening. The thickness of the thick insulating layer determines the height of the capacitor electrode (e.g., about 6,000 Å to 13,000 Å). The etch stop layer serves to terminate the longitudinal etch formation of an inlay opening. After this step, a conductive layer, for example polysilicon, is formed in each inlay opening such that the conductive layer takes the form of a tube which is connected to an adjacent tube at an overlapping center portion, for example, having a thickness of about 400 Å to 600 Å. The conductive layer which results will include an outer surface and at least two inner surface walls which will effectively increase the total effective surface area and thereby increase the possible capacitance.

In yet another principal aspect of the present invention, the area defined by the overlap region of the two circular like inlay openings subsequently forms the overlapping center portion of the conductive layer which lies between the two tubular openings. The addition of this overlapping center portion adds surface area to the capacitor electrode structure without introducing any additional processing steps and complexity.

In yet another principal aspect of the preferred embodiment of the present invention, the capacitor electrode structure includes two tubular portions such that each tubular portion is overlapped into a side of an adjacent tubular portion. Those skilled in the art know that formation of more than two tubular portions may be combined and overlapped together without departing from the spirit and scope of the present invention.

BRIEF DESCRIPTION OF THE DRAWINGS

In the course of the detailed description to follow, reference will be made to the attached drawings, in which.

DETAILED DESCRIPTION OF THE PREFERRED EMBODIMENTS

The present invention is a three dimensional capacitor electrode structure of a capacitor which is designed to maximize an effective surface area of the electrode which may be utilized in a minimum two dimensional memory cell area to achieve high density in a memory array. The present invention uses an inlaying process to form a capacitor electrode of multiple tubular like sections which are overlapped at a common wall portion. The capacitor electrode which results has both an outer vertical wall and at least two inner most vertical tunnel walls which contribute to an overall conductive surface area. This results in a large effective capacitance while maintaining a high density in the array.

The present invention may be targeted towards semiconductor processes which include design rule minimum feature sizes of less than 0.21 microns to incorporate process simplicity and reliability.

Figure 1A:
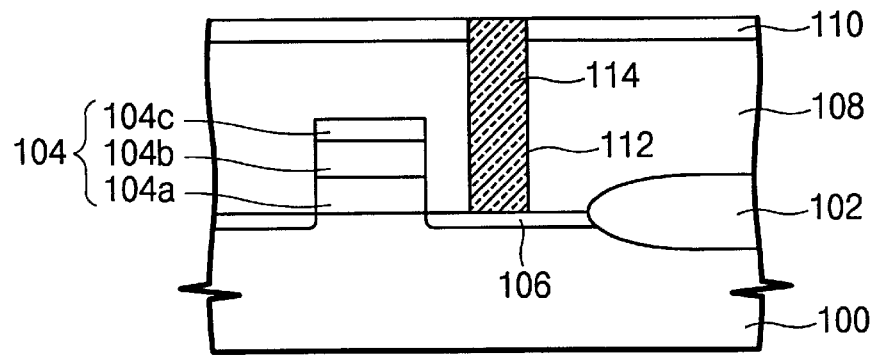
FIG. 1A to FIG. 1H illustrate representational cross-section diagrams of a preferred embodiment of selected stages in the fabrication method of a capacitor electrode according to the present invention, including top view representations incorporated in FIGS. 1B, 1C, 1D, and 1F.

In a preferred embodiment, the present invention is formed as a stacked capacitor in a DRAM memory cell. FIG. 1A illustrates a cross-sectional representation of a portion of an example DRAM memory cell patterned on a substrate 100 having undergone several processing steps in accordance with one preferred embodiment of the present invention. A device isolation layer 102 is formed on a predetermined region of the substrate 100 to define active and field regions, with the substrate 100 being of a first conductivity type, either P- or N-type. A memory cell access transistor includes a gate electrode structure 104 formed on the active region of the semiconductor substrate 100. As an example, the gate electrode structure 104 includes a polysilicon layer 104a, a refractory metal silicide layer 104b, and an insulating layer 104c. Those skilled in the art know that a thin gate oxide layer (not shown) isolates the gate electrode structure 104 from the active region of the substrate 100. Impurity doped regions of a second conductivity type opposite to the first conductivity type of the substrate 100, namely source/drain regions 106, are formed in the semiconductor substrate 100. A first insulating oxide layer 108 is formed over the semiconductor substrate 100 and gate electrode structure 104 by a suitable deposition technique such as chemical vapor deposition (CVD) An etch stop layer 110 is formed over the first insulating oxide layer 108 in order to subsequently process the capacitor electrode inlaying sequence. The etch stop layer 110, for example a includes silicon nitride formed to a thickness of about 100 Å to 500 Å by a CVD technique.

Next, a contact hole or window 112 is formed in the etch stop layer 110 and first insulating oxide layer 108 to expose the source region 106. A conductive layer is deposited over the etch stop layer 110 and the contact hole 112 and then planarized to form a contact plug 114 to electrically couple the capacitor electrode to the source region 106 and to enable the stacking of the capacitor electrode over the gate electrode structure 104 and the device isolation layer 102. The contact plug 114 may be formed with a conductor such as polysilicon or metal (e.g., tungsten) using a CVD technique and then subsequently planarized by a chemical mechanical polishing (CMP) technique or by an etch back technique.

Figure 1B:
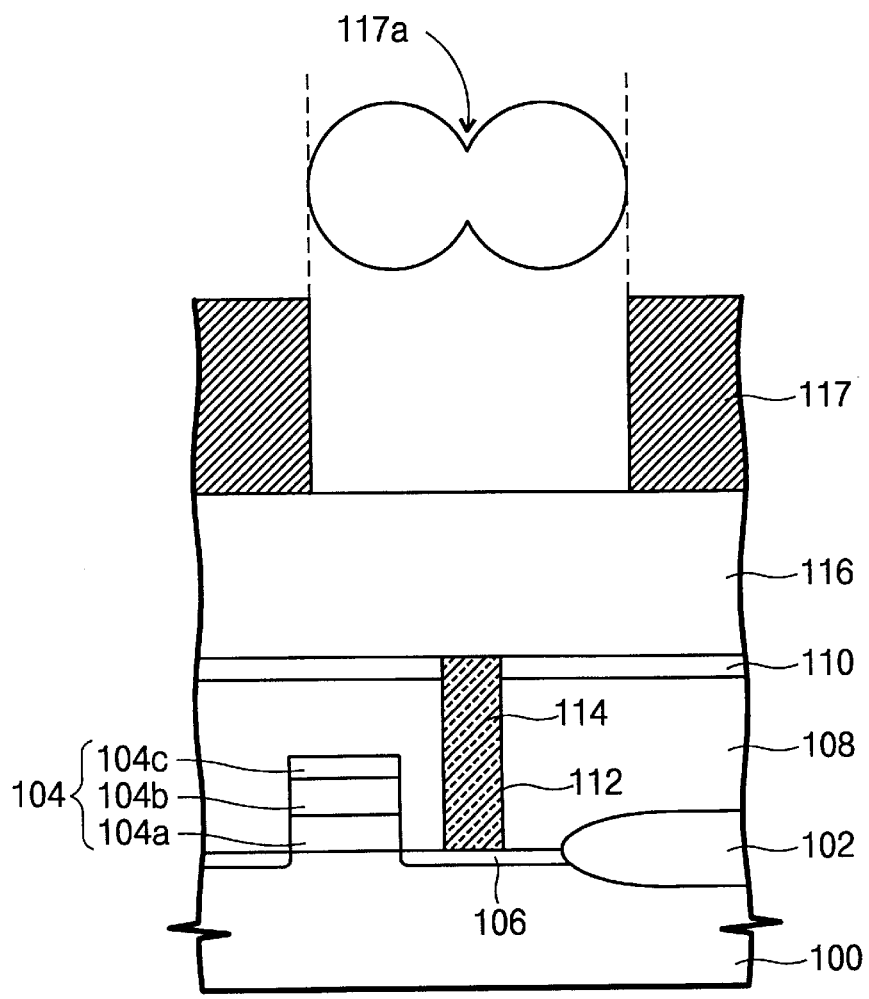

With reference to FIG. 1B, a second insulating layer, namely, thick insulating layer 116 (e.g., an oxide layer with a thickness of about 6,000 Å to 13,000 Å), is formed over the etch stop layer 110 to serve as a sacrificial layer in the formation of the capacitor electrode in certain embodiments. Note that the thick insulating layer 116 material may be chosen such that it has a different etch selectivity from that of the etch stop layer 110. This allows a recessed area formed by an inlay pattern 117a to be anisotropically etched into the thick insulating layer 116 until terminating at the etch stop layer 110. The etch stop layer 110 avoids any etching beyond a predetermined thickness of the thick insulating layer 116. The inlay pattern 117a is formed of, for example a photo-resist pattern 117 which is aligned over contact plug 114.

In this embodiment, the inlay pattern 117a has two circular shapes which both overlap slightly at a region defined by an overlap. The region defined by the overlap will subsequently form an overlapping center portion of a conductive layer. The overlapping portion of the capacitor electrode produces additional surface area without introducing any additional time or processing steps.

Figure 1C:
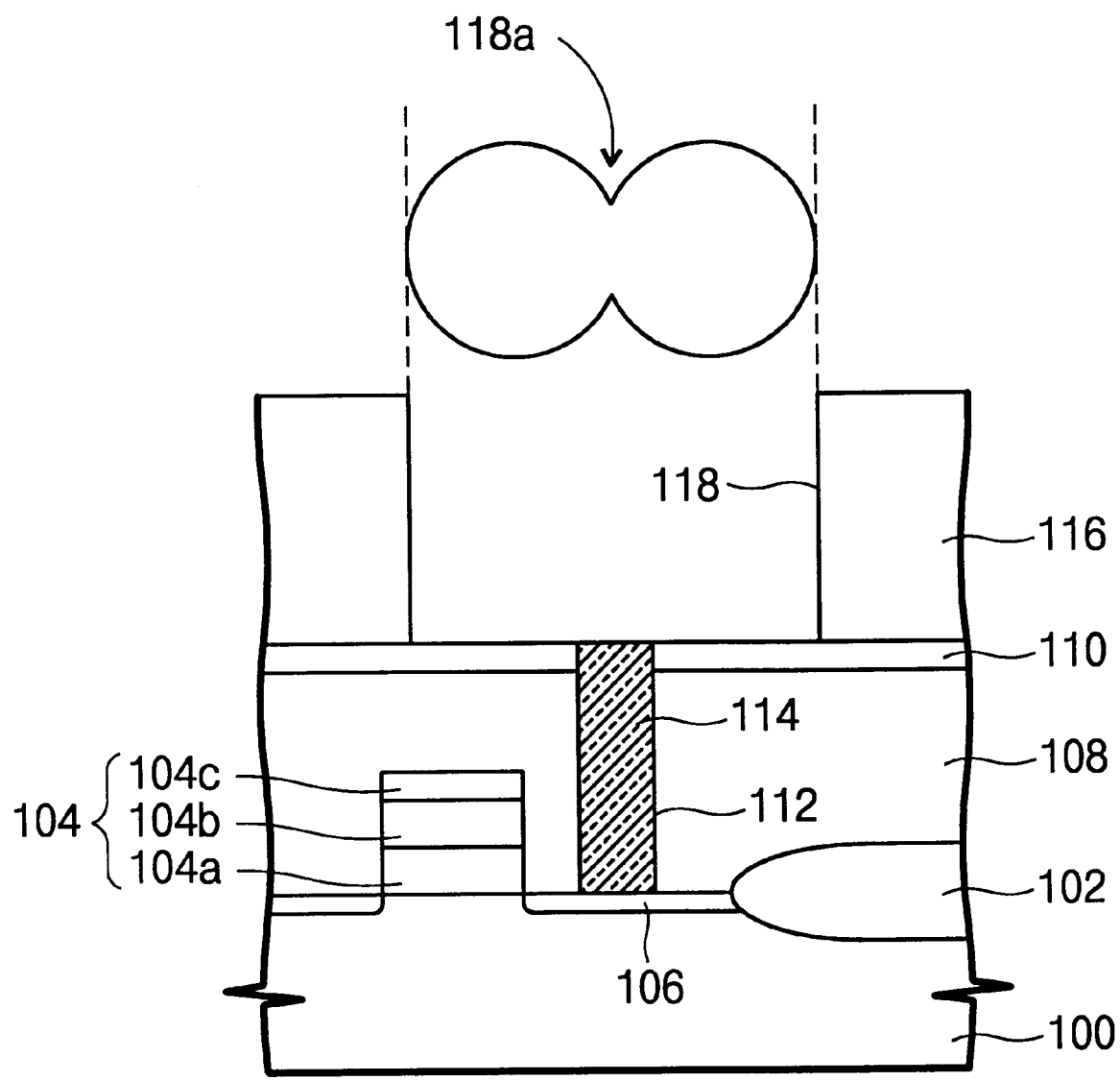

With reference to FIG. 1C, an inlay opening 118 is formed in the thick insulating layer 116 down to the contact plug 114 and a portion of the etch stop layer 110 using the photo-resist pattern 117. The opening has the extruded shape of the inlay pattern 117a in that inner sidewalls of the thick insulating layer 116 are aligned with the edges of the inlay pattern 117a. The opening 118 is formed in the thick insulating layer 116 by an anisotropic etch technique to a predetermined depth. The inlay opening 118 also has an overlapped portion 118a, for example having a width of about 600 Å to 1,200 Å.

Figure 1D:
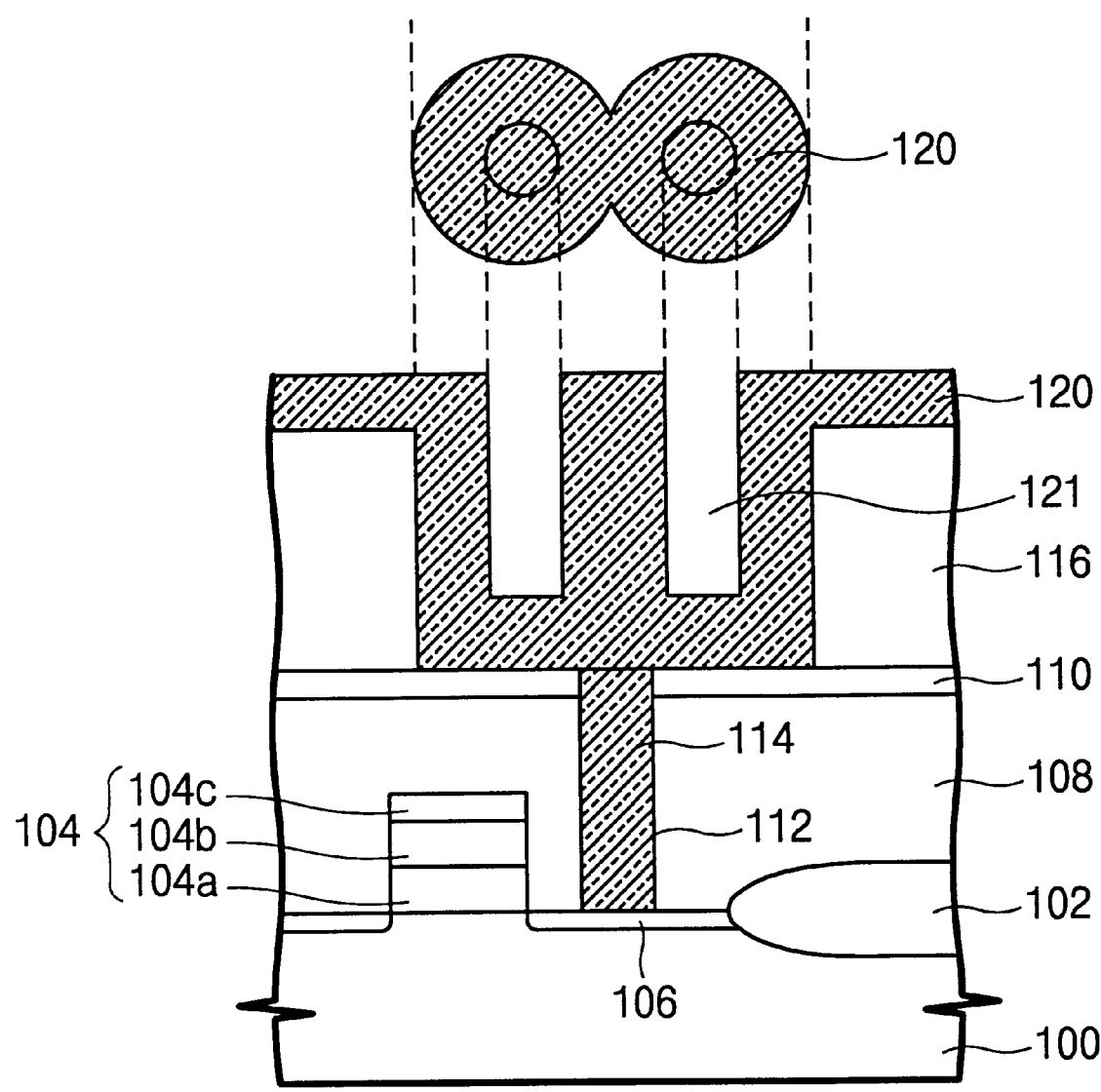

Referring to FIG. 1D, a conductive layer 120, for example polysilicon, is deposited over the thick insulating layer 116 to a controlled thickness (e.g., about 400 Å to 600 Å) thereby forming a tubular section of the conductive layer in the inlay opening 118 of FIG. 1C. The thickness of the conductive layer 120 should be sufficient to form tunnel sections which extend along the vertical height of the thick insulating layer 116 (i.e., the sacrificial oxide layer). The tunnel sections increase the effective surface area of the electrode. Preferably, the thickness of the conductive layer 120 should also be sufficient to form an overlapped conductive portion at overlapped portion 118a in FIG. 1C. The overlapped portion 118a provides increased surface area in the area defined by overlapped conductive portions formed without any additional processing steps. This technique for forming the area defined by overlapped conductive portions results in a capacitor electrode structure with additional surface area. There is also a bottom surface of conductive layer 120 which terminates the tubular sections. The bottom surface is formed on the etch stop layer 110 and contact plug 114.

Though only two tubular sections are overlapped with each other in this embodiment, formation of a structure which includes more than two (e.g., three or four) tubular sections or tubular like sections with overlapped portions are possible. In addition, the tubular sections may be modified such that a horizontal cross section would reveal an oval or additional curves to yield additional surface area. Under these circumstances, the effective capacitance will increase due to the increased surface area of the capacitor electrode.

Figure 1E:
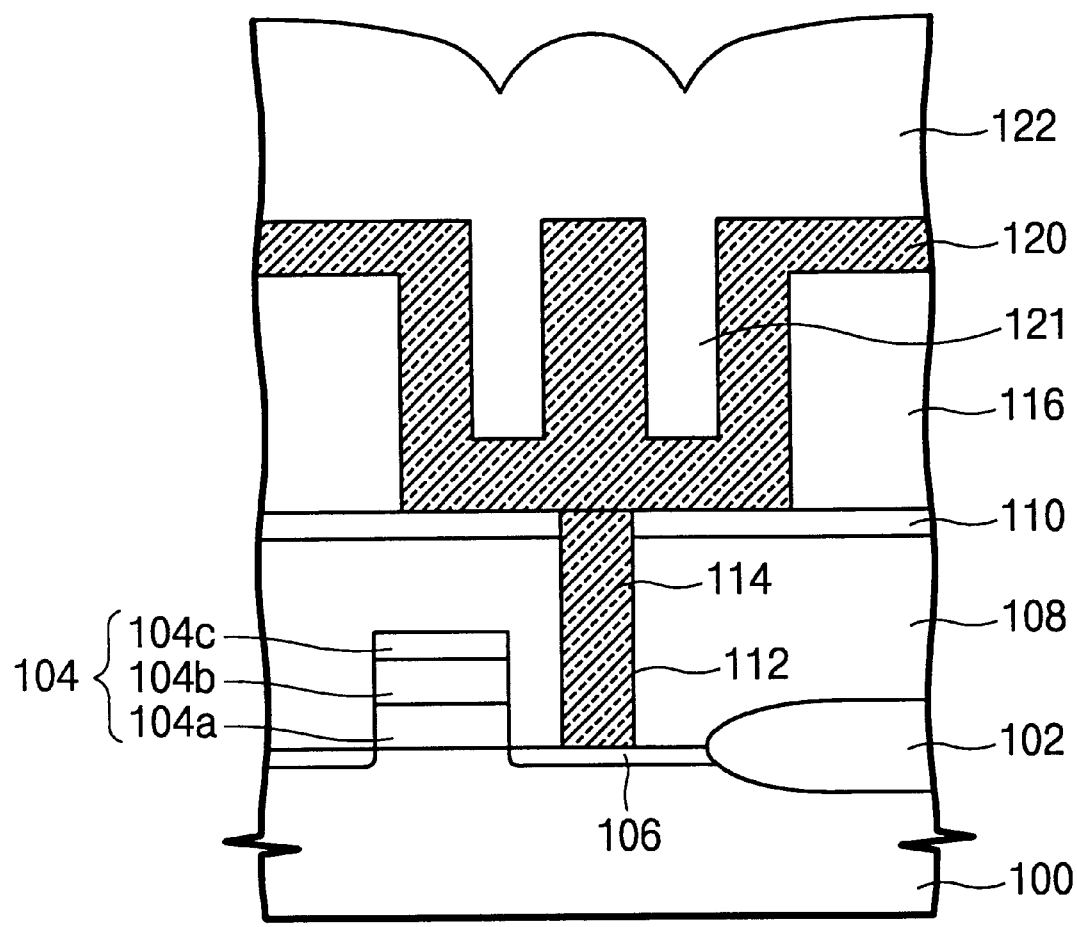

With reference to FIG. 1E, the tunnel section 121 is filled with an electrically nonconductive layer 122 such as a photo-resist layer or an oxide layer to serve as protection from particle impaction within the tunnel section 121 during a subsequent planarization step. A photo-resist layer may be coated in the tunnel section 121 and on the conductive layer 120 and then etched back concurrently until the thick insulating layer 116 is exposed, or an oxide layer may be deposited in the tunnel section 121 and on the conductive layer 120 and then concurrently removed by a CMP technique until the thick insulating layer 116 is exposed to form a planarized double tubular storage node 120a as in FIG. 1F.

A double tubular storage node means that the storage node 120a has a plurality of adjoining upright and parallel tubular sections 120a' and a necked-in section 120a" where the upright tubular sections 120a' join together in an overlapping manner. The storage node thus has a top wall surface 120b, a bottom wall surface 120c, an outer peripheral vertical side wall surface 120d which defines a plurality of concavities 120d' forming the necked-in section 120a", and two inner peripheral side wall surfaces 120e each disposed to a respective side of the necked-in section 120a" and extending downwardly from the top wall surface 120b to a location spaced from the bottom wall surface 120c.

The electrically nonconductive layer 122 is subsequently removed from the tunnel sections 121. For example, if the nonconductive layer 122 is photoresist then it may be removed by ashing and stripping and if the nonconductive layer 122 is oxide then it may be removed by a wet etch technique. During this process the thick insulating layer 116 can be removed simultaneously.

Once the electrically nonconductive layer 122 is removed the remainder of the thick insulating layer 116 can then be removed, for example, by the wet etch technique, if the thick insulating layer 116 includes oxide. As shown in the side cross section of FIG. 1G, the resultant storage node 120a consists of a plurality of upright tubular sections. A capacitor dielectric layer 124 can then be deposited on the storage node 120a, and a top electrode (i.e., plate node) 126 can then be formed on the capacitor dielectric layer 124, to thereby form the capacitor as shown in FIG. 1G. In this example, the height of the storage node 120a is about 6,000 Å to 13,000 Å and the thickness of wall portion is about 400 Å to 600 Å.

Figure 1F:
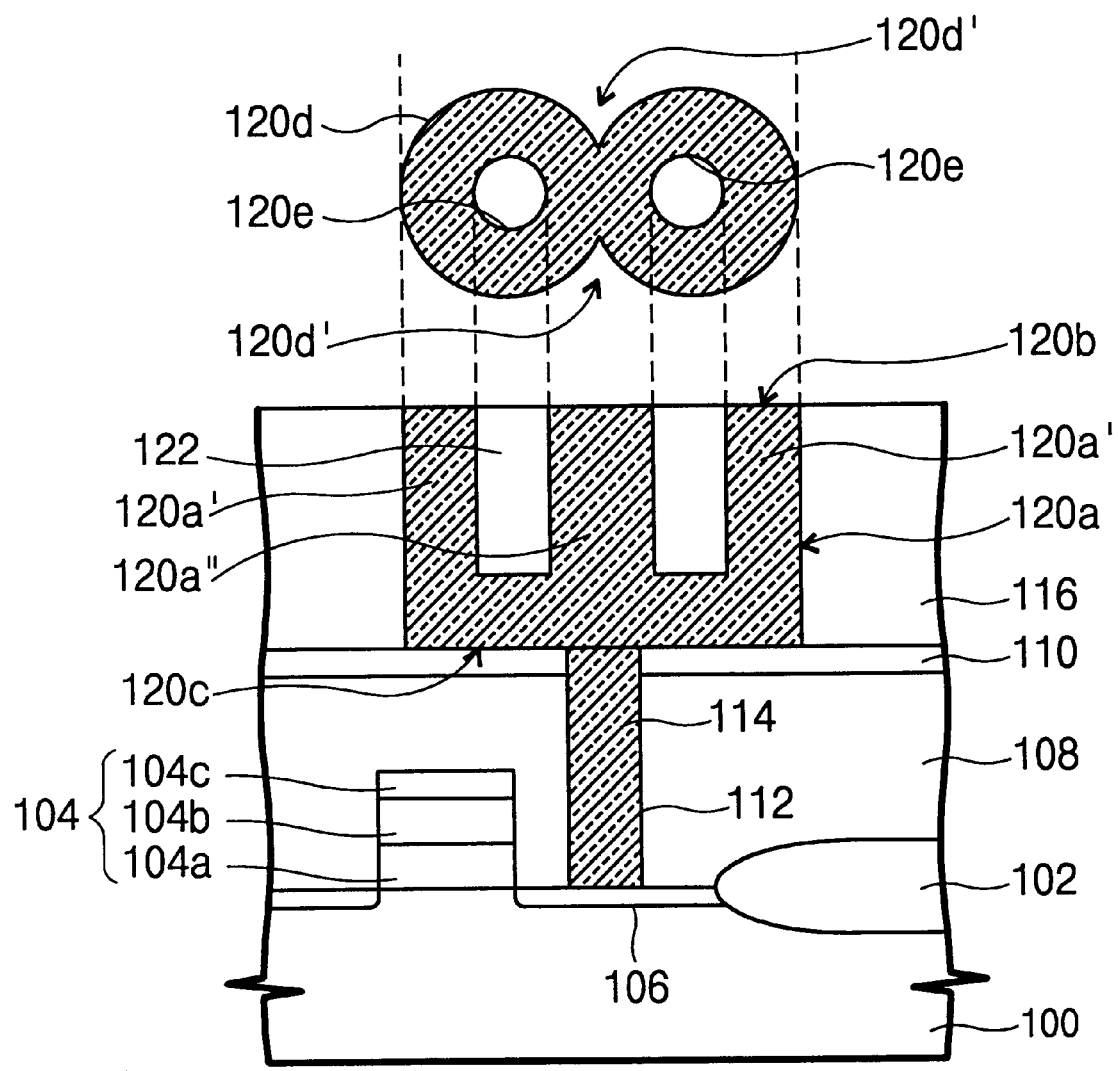
Figure 1G:
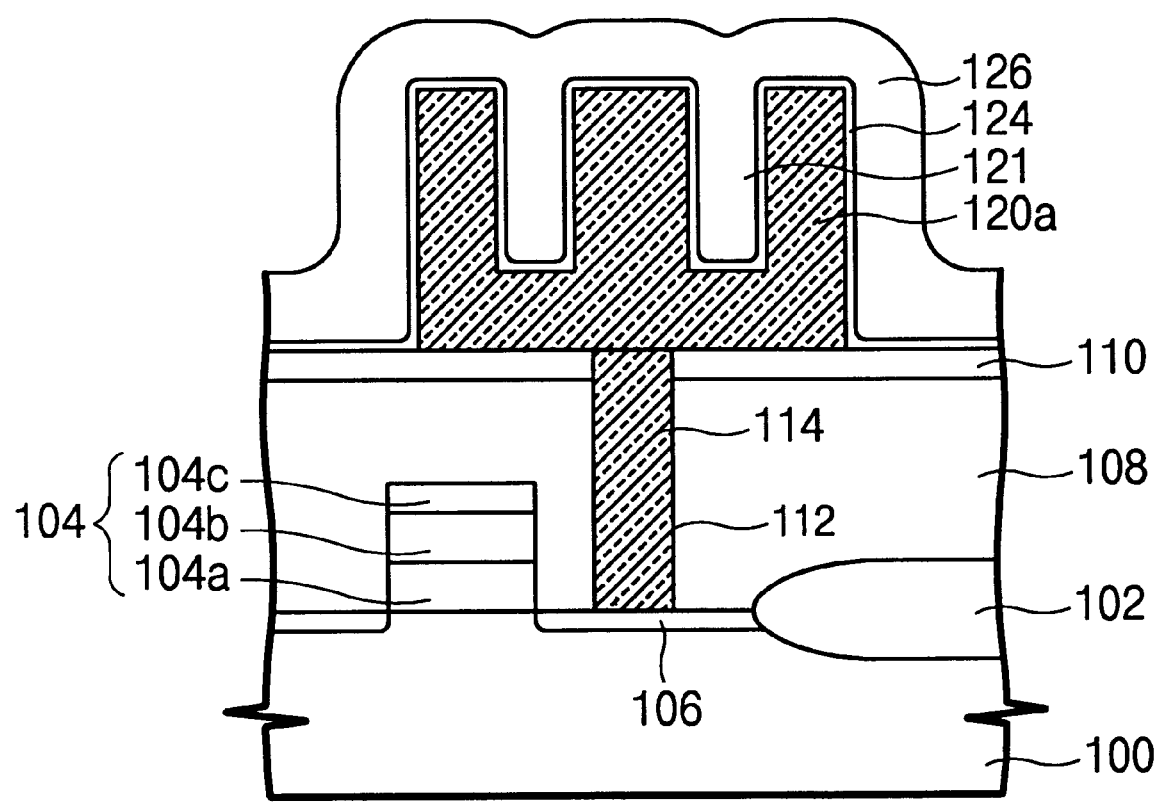
Figure 1H:
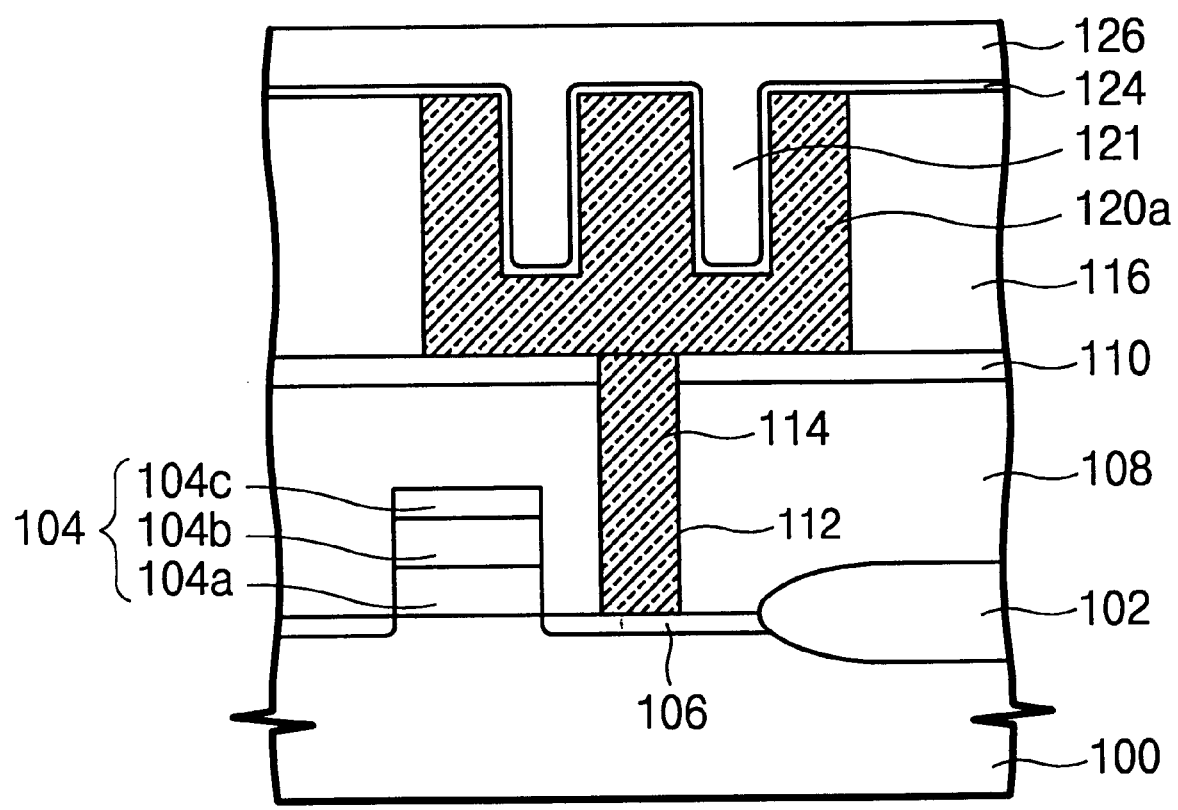

The step of removing the thick insulating layer 116 outside of the tunnel sections may be skipped (see FIG. 1F). In such a case, after removing the electrically nonconductive layer 122 from the tunnel sections 121, a capacitor dielectric layer 124 can then be deposited on the storage node 120a, and a top electrode (i.e., plate node) 126 can then be formed on the capacitor dielectric layer 124, to thereby form the capacitor as shown in FIG. 1H.

The present invention has advantages of providing sufficiently high surface area in a capacitor electrode for a capacitor of high capacitance suited for a high density layout for manufacturing very high density memory devices. The method of the present invention has advantages of forming the capacitor mentioned above with a feature of a region defined by an overlap between at least two tubular sections, which minimizes process complexity by not introducing any additional processing steps. The feature of the region defined by the overlap between at least two tubular sections in the capacitor electrode also increases the effective surface area for increased capacitance in a capacitor.

While this invention has been particularly shown and described with reference to the preferred embodiment thereof, it will be understood by those skilled in the art that various changes in form and detail may be made without departing from the spirit and scope of this invention.

What is claimed is:

1. A semiconductor device comprising:

a semiconductor substrate of a first conductivity type;

a gate electrode spaced apart from the substrate through a gate insulating layer;

impurity doped regions of a second conductivity type opposite to the first conductivity type, the impurity doped regions being disposed in the substrate and adjacent to the gate electrode;

an insulating layer covering the semiconductor substrate and the gate electrode;

a storage node connected to one of the impurity doped regions, said storage node having a plurality of upright and parallel tubular sections adjoining one another in an overlapping manner and a necked-in section where said upright tubular sections overlap, and said storage node having a top wall surface, a bottom wall surface, an outer peripheral vertical side wall surface which defines a plurality of concavities constituting said necked-in section, and at least two inner peripheral vertical side wall surfaces extending downwardly from said top wall surface to a location spaced from said bottom wall surface so as to define tunnels in the storage node;

a capacitor dielectric layer disposed on the storage node and covering the top wall surface and the outer and inner peripheral side wall surfaces thereof; and a plate node disposed on the capacitor dielectric layer across from the top wall surface and the outer and inner peripheral side wall surfaces of said storage node.

2. The semiconductor device according to claim 1, wherein the storage node is connected to one of the impurity doped regions through a contact plug formed in the insulating layer.

3. The semiconductor device according to claim 1, wherein the gate electrode has a design rule less than 0.21 microns.

4. The semiconductor device according to claim 1, further comprising an etch stop layer disposed between the storage node and the insulating layer.

5. The semiconductor device according to claim 1, wherein the storage node has a thickness of about 400 Å to 600 Å.

6. A semiconductor device comprising:

a semiconductor substrate of a first conductivity type;

a gate electrode spaced apart from the substrate through a gate insulating layer;

impurity doped regions of a second conductivity type opposite to the first conductivity type, the impurity doped regions being disposed in the substrate and adjacent to the gate electrode;

a first insulating layer covering the semiconductor substrate and the gate electrode;

a second insulating layer formed over the first insulating layer, wherein the second insulating layer has an inlay opening;

a storage node occupying said inlay opening and connected to one of the impurity doped regions, said storage node having a plurality of adjoining upright and parallel tubular sections and a necked-in section where said upright tubular sections join together in an overlapping manner, and said storage node having a top wall surface, a bottom wall surface, an outer peripheral vertical side wall surface which defines a plurality of concavities constituting said necked-in section, and at least two inner peripheral vertical side wall surfaces extending downwardly from said top wall surface to a location spaced from said bottom wall surface so as to define tunnels in the storage node;

a capacitor dielectric layer disposed on the storage node; and a plate node disposed on the capacitor dielectric layer.

7. The semiconductor device according to claim 6, wherein the storage node is connected to one of the impurity doped regions through a contact plug formed in the first insulating layer.

8. The semiconductor device according to claim 6, wherein the gate electrode has a design rule less than 0.21 microns.

9. The semiconductor device according to claim 6, further comprising an etch stop layer disposed between the first insulating layer and the second insulating layer.

10. The semiconductor device according to claim 6, wherein the storage node has a thickness of about 400 Å to 600 Å.

* * * * *